United States Patent
Halbmaier et al.

(10) Patent No.: US 7,400,383 B2
(45) Date of Patent: Jul. 15, 2008

(54) ENVIRONMENTAL CONTROL IN A RETICLE SMIF POD

(75) Inventors: David L. Halbmaier, Shorewood, MN (US); Anthony Simpson, Savage, MN (US); William M. Goodwin, Medway, MA (US); Oleg P. Kishkovich, Greenville, RI (US); Thomas B. Kielbaso, Colorado Springs, CO (US); Frank Manganiello, Maplewood, MI (US)

(73) Assignee: Entegris, Inc., Chaska, MN (US)

( * ) Notice: Subject to any disclaimer, the term of this patent is extended or adjusted under 35 U.S.C. 154(b) by 33 days.

(21) Appl. No.: 11/396,949

(22) Filed: Apr. 3, 2006

(65) Prior Publication Data

US 2006/0266011 A1 Nov. 30, 2006

Related U.S. Application Data

(60) Provisional application No. 60/668,189, filed on Apr. 4, 2006.

(51) Int. Cl.
*G03B 27/58* (2006.01)

(52) U.S. Cl. .......................... 355/72; 355/75; 206/449; 206/454; 250/492.1; 250/492.2; 378/34; 55/318

(58) Field of Classification Search .................. 355/72, 355/75, 77; 206/449, 454; 250/492.1, 492; 378/34, 35
See application file for complete search history.

(56) References Cited

U.S. PATENT DOCUMENTS

| | | | |
|---|---|---|---|
| 4,121,207 A | 10/1978 | Jones | |
| 4,609,103 A | 9/1986 | Bimer et al. | |
| 4,666,479 A | 5/1987 | Shoji | |
| 6,187,182 B1 * | 2/2001 | Reynolds et al. ............ 210/136 |
| 6,319,297 B1 | 11/2001 | Fosnight | |
| 6,346,518 B1 | 2/2002 | Heeres et al. | |
| 6,447,584 B1 | 9/2002 | Kishkovich et al. | |
| 6,610,128 B2 | 8/2003 | Kishkovich | |
| 6,645,898 B2 | 11/2003 | Alvarez, Jr. et al. | |
| 6,690,993 B2 | 2/2004 | Foulke et al. | |
| 6,715,495 B2 | 4/2004 | Dao et al. | |
| 6,761,753 B2 | 7/2004 | Kishkovich et al. | |
| 6,763,608 B2 | 7/2004 | Dao et al. | |

(Continued)

OTHER PUBLICATIONS

Yield Management Solutions, *Reticle Inspection*, Spring 2004, pp. 34-37.

*Primary Examiner*—Della Rutledge
(74) *Attorney, Agent, or Firm*—Patterson, Theunte, Skaar & Christensen, P.A.

(57) ABSTRACT

The present invention provides a standardized mechanical interface (SMIF) reticle pod that is configured to provide a controlled environment for supporting a reticle wherein the controlled environment is maintained substantially free of crystal growth causing contaminants. Accordingly, there is provided a layered filter with filter elements capable of filtering particulates and adsorbing gaseous contaminants. The filter has an inwardly facing face generally planar shaped with a surface area that is substantially half or more of the area of the reticle face. The inwardly facing face is placed in close proximity to the reticle patterned surface and has an area that is a significant fraction of the reticle patterned surface area. The SMIF pod is also provided with a purge system configured to inject a very dry gas within the controlled environment to flush the controlled environment of contaminants as well as to regenerate the filter.

31 Claims, 11 Drawing Sheets

U.S. PATENT DOCUMENTS

| | | |
|---|---|---|
| 7,014,693 B2 | 3/2006 | Kishkovich et al. |
| 2003/0082030 A1 | 5/2003 | Del Puerto et al. |
| 2004/0005209 A1 | 1/2004 | Su et al. |
| 2005/0040345 A1 * | 2/2005 | Bakker et al. ............ 250/492.2 |

* cited by examiner

ENVIRONMENTAL CONTROL IN A RETICLE SMIF POD

RELATED APPLICATION

The present application claims the benefit of U.S. Provisional Application No. 60/668,189 filed Apr. 4, 2005, which is incorporated herein in its entirety by reference.

FIELD OF THE INVENTION

The invention relates to standardized mechanical interface (SMIF) substrate carriers used in semiconductor manufacturing and more particularly to transportable and shippable reticle/photomask carriers that include a filtration system to reduce chemical and particulate contaminants within the controlled environment of the carrier.

BACKGROUND OF THE INVENTION

The processing of silicon wafers for semiconductor applications typically includes photolithography as one of the process steps. In photolithography, a wafer surface with a deposit of silicon nitride is coated over with a light-sensitive liquid polymer or photoresist and then selectively exposed to a source of radiation using a template with a desired pattern. Typically, ultraviolet light is shone through or reflected off a surface of a mask or reticle to project the desired pattern onto the photoresist covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. The wafer is subjected to an etch process that removes the exposed portion of the nitride layer leaving a nitride pattern on the wafer in the exact design of the mask.

The industry trend is towards the production of chips that are smaller and/or with a higher logic density necessitating even smaller line widths on larger wafers. Clearly, the degree of fineness to which the surface of the reticle can be patterned and the degree to which this pattern can be faithfully replicated onto the wafer surface are factors that impact the quality of the ultimate semiconductor product. The resolution with which the pattern can be reproduced on the wafer surface depends on the wavelength of ultraviolet light used to project the pattern onto the surface of the photoresist-coated wafer. State-of-the-art photolithography tools use deep ultraviolet light with wavelengths of 193 nm, which allow minimum feature sizes on the order of 100 nm. Tools currently being developed use 157 nm Extreme Ultraviolet (EUV) light to permit resolution of features at sizes below 70 nm. The reticle is a very flat glass plate that contains the patterns to be reproduced on the wafer. Typical reticle substrate material is quartz. Because of the tiny size of the critical elements of modern integrated circuits, it is essential that the operative surface of the reticle (i.e. the patterned surface) be kept free of contaminants that could either damage the surface or distort the image projected onto the photoresist layer during processing leading to a final product of unacceptable quality. Typically, the critical particle sizes are 0.1 µm and 0.03 µm for the non-patterned and patterned surfaces respectively when EUV is part of the photolithography process. Generally, the patterned surface of the reticle is coated with a thin, optically transparent film, preferably of nitrocellulose, attached to and supported by a frame, and attached to the reticle. Its purpose is to seal out contaminants and reduce printed defects potentially caused by such contamination in the image plane. However, extreme EUV utilizes reflection from the patterned surface as opposed to transmission through the reticle characteristic of deep ultraviolet light photolithography. At his time, the art does not provide pellicle materials that are transparent to EUV. Consequently, the reflective photomask (reticle) employed in EUV photolithography is susceptible to contamination and damage to a far greater degree than reticles used in conventional photolithography. This situation imposes heightened functional requirements on any reticle SMIF pod designed to store, transport and ship a reticle destined for EUV photolithography use.

It is well known in the art that unnecessary and unintended contact of the reticle with other surfaces during manufacturing, processing, shipping, handling, transport or storage will likely cause damage to the delicate features on the patterned surface of the reticle due to sliding friction and abrasion. Likewise, it is generally accepted by those skilled in the art that any particulate contamination of the surface of the reticle can potentially compromise the reticle to a degree sufficient -to seriously affect the end products of processes that use such a flawed reticle. In this regard, the art has developed innovative approaches to locate and support the reticle in reticle containers so as to reduce or eliminate sliding friction and consequent abrasion of the reticle and the resultant generation of contaminating particulates. In recognition of the need to maintain a controlled environment around the wafer during storage, processing and transport, the prior art has evolved approaches to isolation technology that allows for control of the environment in the immediate vicinity of a wafer by providing for a container so that it can be kept relatively free from incursion of particulate matter. Typically, containers are provided with standardized mechanical interfaces that allow automatic manipulation of the container by processing machinery. Such containers can hold photomasks of up to 200 mm and are designated standard mechanical interface pods, or SMIF-Pods. Even with such a controlled environment, migration of particulates that may be present inside the controlled environment is still possible due to pressure changes of the air trapped in the controlled environment or turbulence of the trapped air brought on by rapid movements of the container and/or by disturbing the trapped air volume. For example, thin walled SMIF pods may experience wall movement due to altitude related pressure changes causing the trapped air inside the controlled environment to be displaced. Temperature changes can set up convection currents within the container. Dimensional changes of the container and its components due to pressure fluctuations can lead to compromising the sealing between cover and door of the carrier and incursion of particulates within the carrier. Prior art approaches contemplate a breathing apparatus between the external environment and the internal controlled volume of air. The breathing apparatus provides a path for the air to flow. Prior art breathing apparatus may include a particulate filter to block the entry of particulates from the external environment into the controlled environment of the carrier.

Those skilled in the art will appreciate that particulate contaminants are but one half of the equation. Equally important are gas-phase contaminants or airborne molecular contaminants (AMC) due to ambient air venting or leaking into or getting trapped in a hermetically sealed system. For example, at a suitable dew point temperature, the moisture in the air will condense out of the air and some of it may get deposited onto the reticle. Even with a perfectly sealed container, there is the possibility of air entering into the system when the reticle is removed from and replaced within the container during processing. Water vapor condensing onto the patterned surface of the reticle can interfere with the optics just as a solid particulate would. Other sources of gas-phase or vapor contamination are solvent residues resulting from reticle/pod cleaning operations during the photomask lifecycle, chemical agents. generated by out-gassing from the structural components of the carrier and chemical agents that enter into the carrier from the ambient atmosphere by breaching the hermetic sealing arrangement between the carrier shell and the carrier door. Multiple contamination species are thought to be the largest contributors to gas-phase contamination. These include $NH_3$ (ammonia), $SO_2$ (sulphur dioxide), $H_2O$ (moisture) and condensable organics C6-C10. Depending on the photolithography system, a photomask can be exposed to a laser light source of a wavelength that can range from 436 nm to 157 nm. Currently, 193 nm lasers are quite common. The energy of the laser can initiate chemical reactions that precipitate defect formation and propagation on the surface of the reticle. For instance, some of the chemical species are altered to form highly reactive species such as $SO_4^{2-}$ and $NH_4^+$. Some of these chemicals, such as acids for instance, are reactive with glass and can damage the reticle by etching it to create a haze on the patterned surface. The bases can create resist poisoning. The condensable organics can lead to SiC formation. In general, all of the contaminants can be considered to result in the same effect: crystal growth that degrades the functionality of the reticle. In this respect, the current thinking is that moisture or water is one of the key ingredients required for crystal growth. Essentially, water combines with some of the aforementioned contaminants to form the salts are generally clubbed together under the rubric of crystal growth. Prior art use of dessicants, for example, cannot ameliorate this problem because they cannot reduce the concentration of moisture to low enough levels to prevent salt (or crystal) formation. Likewise, purging a reticle carrier with clean dry air (CDA) or other dry gas may not reduce the moisture concentration to the levels required to avoid crystal growth. There is therefore a need for a contamination control mechanism at each stage of the reticle life cycle.

One of the approaches commonly employed in the art to ameliorate the effect of the chemical contaminants is periodic reticle/mask cleaning. The mean time between such cleans (MTBC) can approach, for example, approximately 8000 wafers in a 193 nm exposure tool. The threshold of the MTBC is set to prevent mean time between defects (MTBD) printed on the wafer using the reticle/mask. However, there is a limit to the number of such 'cleans' a reticle/mask can be subject to before resolution is degraded beyond functionality and the mask must be scrapped. In view of the above, one of skill in the art will recognize the need to ensure that the reticle environment within the carrier remains clean during storage, transportation, manipulation as well as during the standby condition when the carrier is empty of the reticle. While desirable, it is generally infeasible to construct a hermetically sealed environment that is absolutely impervious to incursion by AMCs or other contaminants. It is also infeasible to continuously purge the reticle carrier especially when the reticle and reticle carrier have to be transported or shipped.

What is needed is some type of structure or device for ensuring that the incursion, concentration and rate of accumulation of AMCs within the photomask carrier is controlled to levels that preclude or significantly reduce the formation of crystalline salts so that the useful life of the photomask can be significantly extended.

SUMMARY OF THE INVENTION

The present invention provides a reticle/mask carrier with a controlled environment within which to house a reticle during storage, transport, processing and shipping. According to a primary embodiment of the present invention, the reticle/mask carrier is equipped with means to control the ingress and build-up of particulate and gas-phase contaminants into the controlled environment.

According to one aspect of the invention, the reticle carrier is provided with a layered filter having specialized filter elements arranged to form a composite sandwich. Each filter element is associated with specialized media characterized by its ability to selectively capture at least one of the several trace impurities known to be present within or known to diffuse into the hermetically sealed space within the reticle carrier.

According to another aspect of the present invention, the filter media is selected to weakly bind to the contaminants so that the contaminants could be expelled from the filter by subjecting the filter to a flow of pressurized gas thereby regenerating the filter.

According to a related embodiment of the present invention, the filter is shaped, sized and located so as to present a surface on which particulates will preferentially settle instead of settling on the patterned surface of the reticle. Another aspect of the alternate embodiment contemplates a large filter, i.e. a filter with at least one major surface are that is preferably at least sixty percent of the surface area of the patterned surface, to take advantage of the diffusion length of the particulates within the container to cause the particulates to preferentially settle on the filter as opposed to settling on the patterned surface of the reticle. According to another aspect of the primary embodiment, the filter is preferably shaped and sized substantially proportionate to the reticle and preferably positioned substantially concentrically with respect to the reticle. One aspect of this embodiment at least one surface of the filter is disposed substantially to the carrier door portion with the reticle residing on the reticle supports.

According to a related embodiment, the present invention provides means for limiting the exposure of the filtration medium to the exterior of the reticle pod as compared to the interior of the hermetically sealed space within the reticle carrier. One aspect of the means involves providing a perforated tray to hold the filter wherein the perforations present a restricted area through which the filter communicates with the external environment. Another aspect of the means involves providing a filter with an additional fluid impermeable layer that is provided with one way slit valves to prevent the ambient air from communicating with the hermetically sealed space within the reticle carrier. Another aspect of the means involves the provision of check valves in the purge ports to keep contaminants from entering the hermetically sealed space.

According to yet another primary embodiment of the present invention, the reticle carrier is provided with a means to inject pressurized, extremely clean dry air, denominated XCDA, into the hermetically sealed space of the reticle carrier and a means to exhaust the XCDA from the sealed space. The purge gas is sufficiently pressurized to allow egress of the gas through both the filter and the exhaust means. Purging the hermetically sealed space in this manner serves to flush out contaminants as well as dehumidify the filter and the reticle carrier thereby regenerating the filter.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENTS

Figure 1:
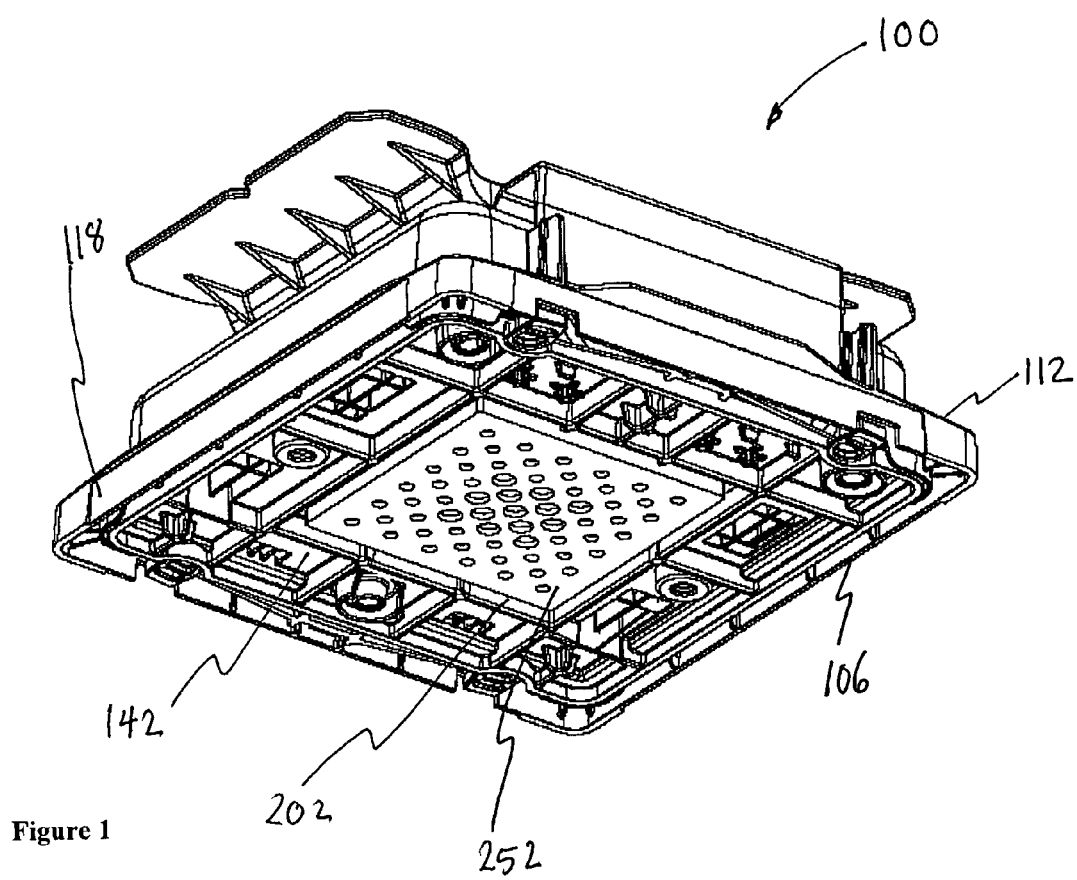
FIG. 1 is a bottom perspective view of an assembly of a reticle carrier according to a primary embodiment of the present invention.

The accompanying Figures depict embodiments of the reticle carrier of the present invention, and features and components thereof. Any references to front and back, right and left, top and bottom, upper and lower, and horizontal and vertical are intended for convenience of description, not to limit the present invention or its components to any one positional or spatial orientation. Any dimensions specified in the attached Figures and this specification may vary with a potential design and the intended use of an embodiment of the invention without departing from the scope of the invention.

In FIGS. 1-11, there is shown a reticle carrier 100 equipped with a chemical filtration system according to a primary embodiment of the present invention. The reticle carrier 100 (alternatively referred to as a reticle container, a reticle pod, or a reticle box) generally comprises a door portion 106 (alternatively referred to as a base portion) which mates with a carrier shell 112 (alternatively referred to as a cover) to form an hermetically sealed space 118 which provides a sealed environment in which a reticle 124 may be stored and transferred. The term "reticle" in used in a broad sense to include quartz blanks, photo-masks, masks used in the semiconductor industry that are susceptible to damage from particulates and gas-phase chemical contaminants. Generally, the reticle 124 is square shaped with a first surface 126 opposite a second patterned surface 128 having a surface area 129 provided with the etched pattern as discussed above. A reticle lateral surface 130 separates the first surface 126 from the second patterned surface 128 and extends around a reticle perimeter 130. It will be appreciated that the present invention is not limited by a particular shape of reticle 124.

Figure 2:
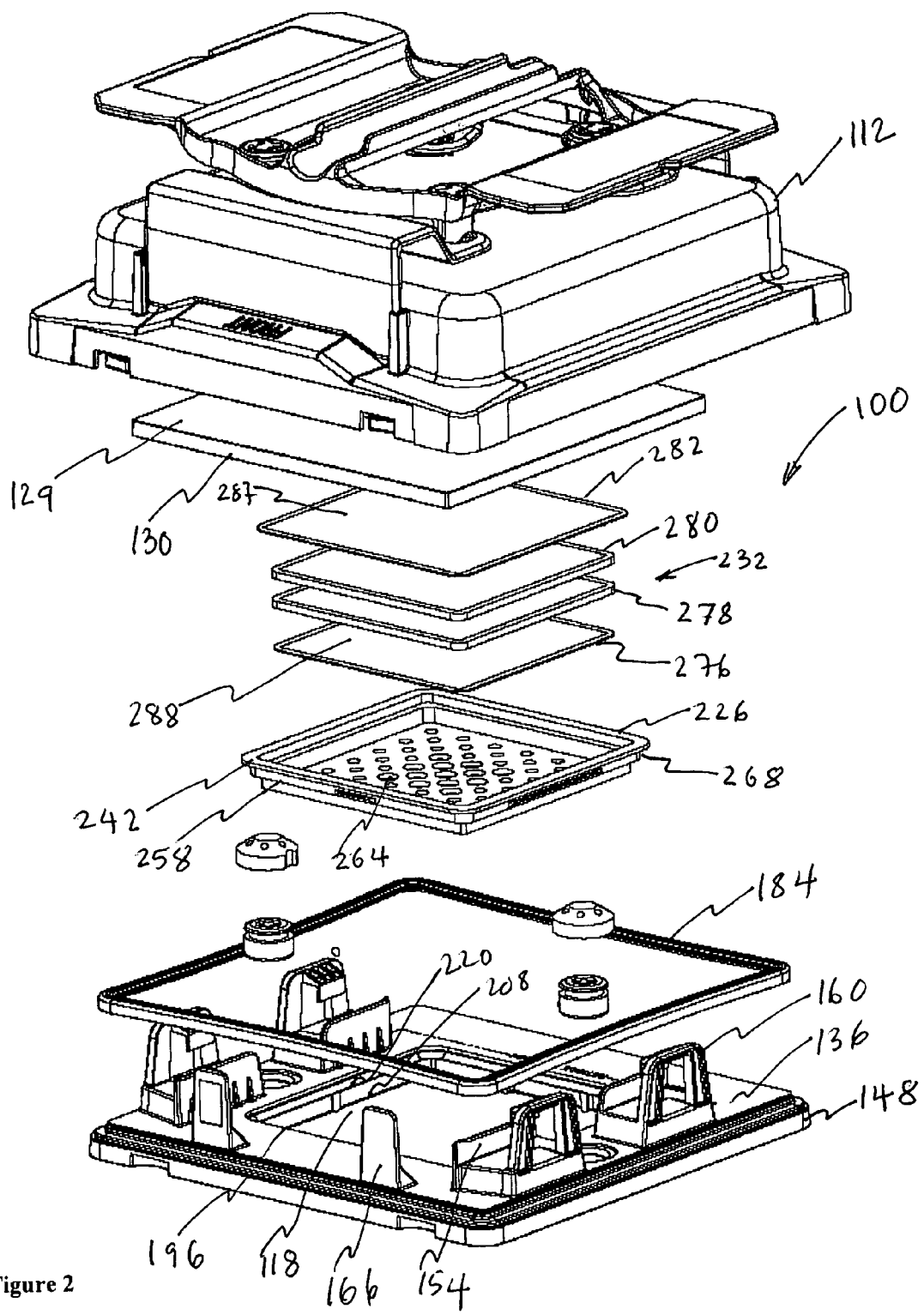
FIG. 2 is an exploded perspective view of the assembly of the reticle carrier according to the primary embodiment of the present invention.
Figure 3:
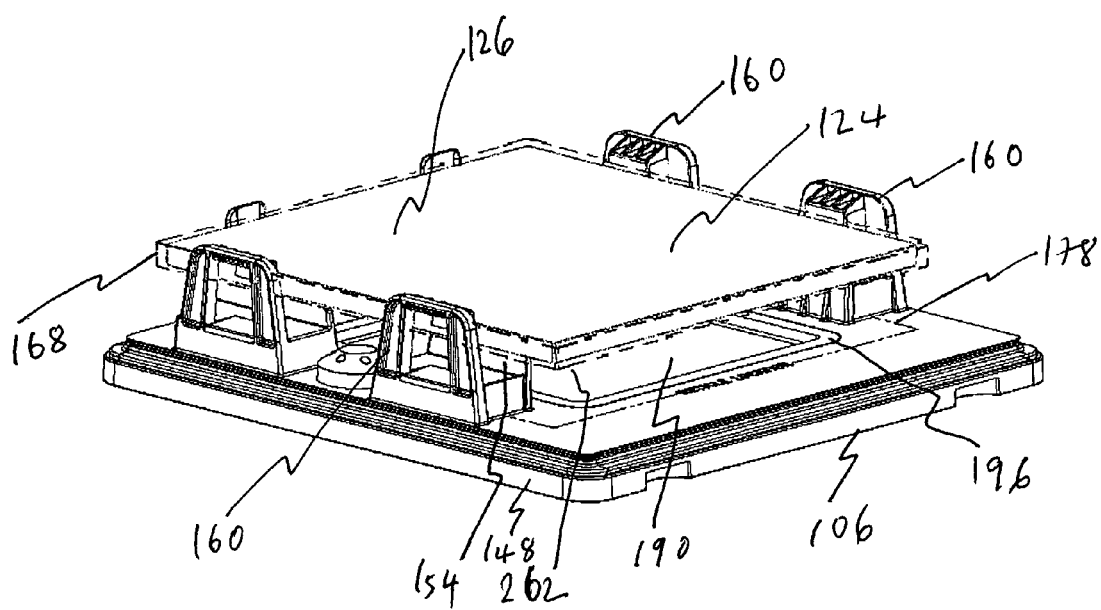
FIG. 3 is a perspective view of a base portion of the reticle carrier of FIG. 1 shown supporting a reticle.
Figure 4:
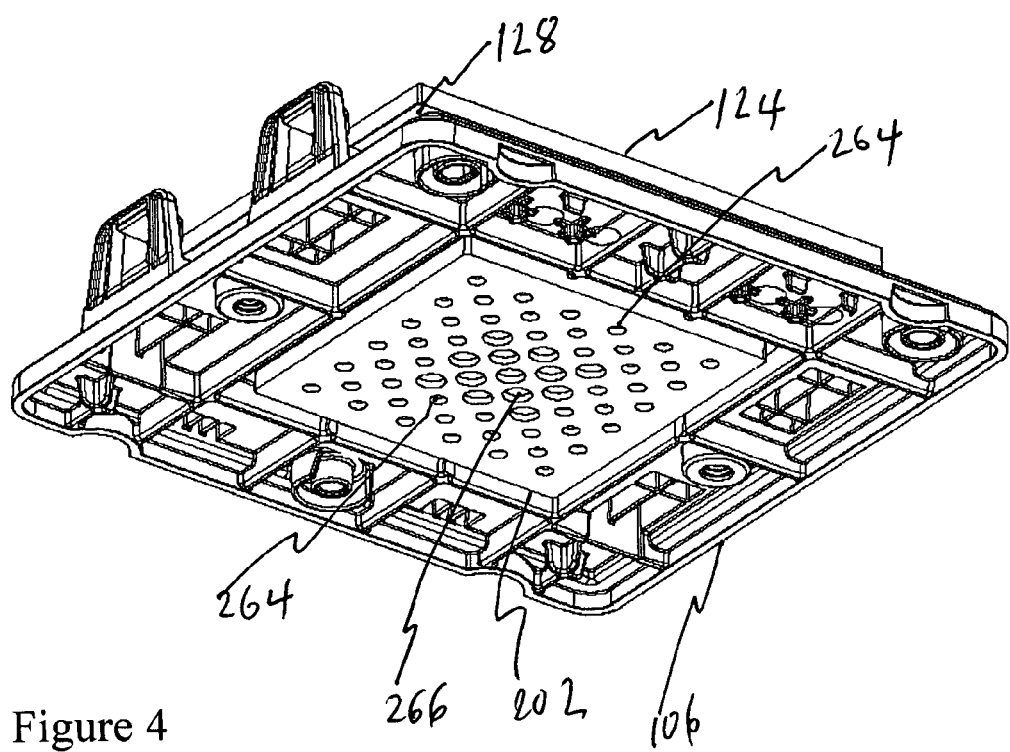
FIG. 4 is a bottom perspective looking upward of the base portion of the reticle carrier of FIG. 3.
Figure 5:
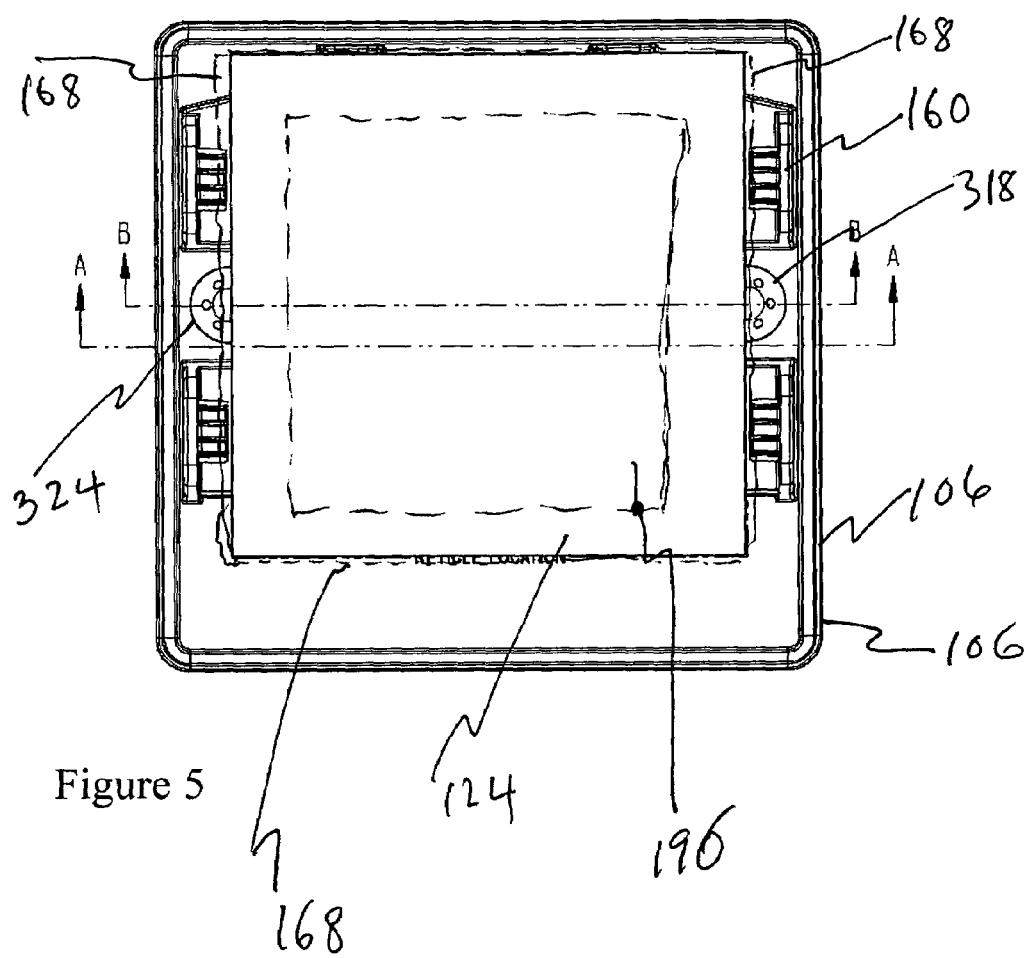
FIG. 5 is a plan view of the base portion of FIG. 3.
Figure 6:
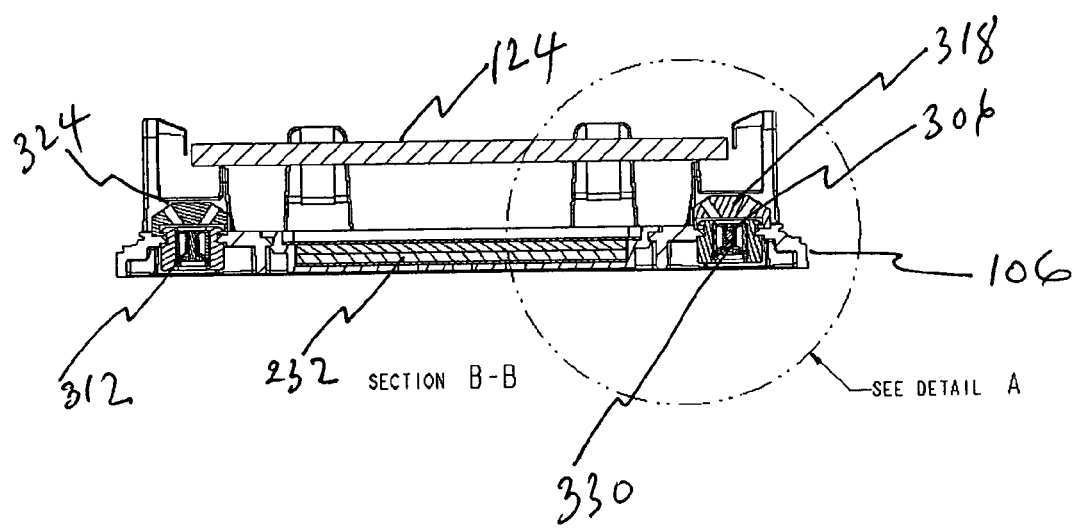
FIG. 6 is a side sectional view through section B-B of the base portion of FIG. 5.
Figure 7:
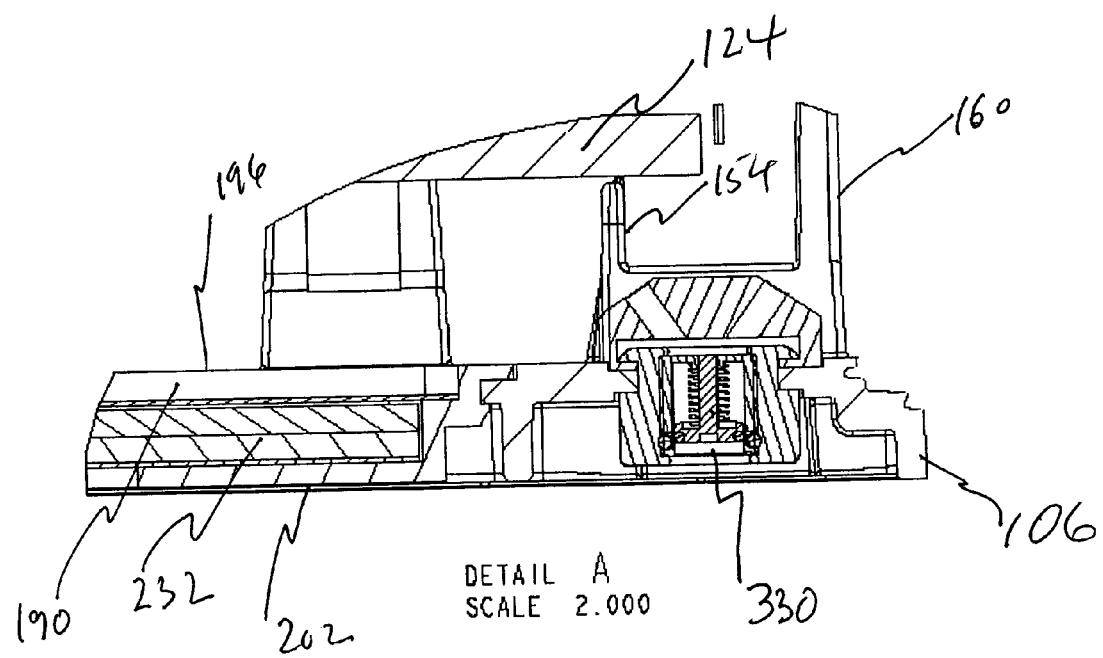
FIG. 7 is a detailed view showing the purge port of FIG. 6.
Figure 8:
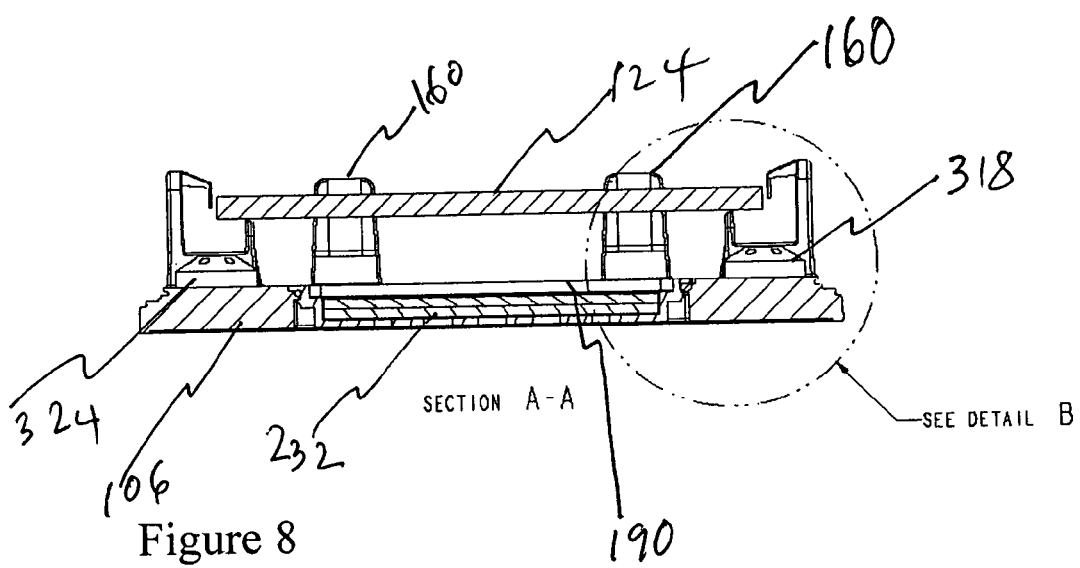
FIG. 8 is a side sectional view through section A-A of the base portion of FIG. 5.
Figure 9:
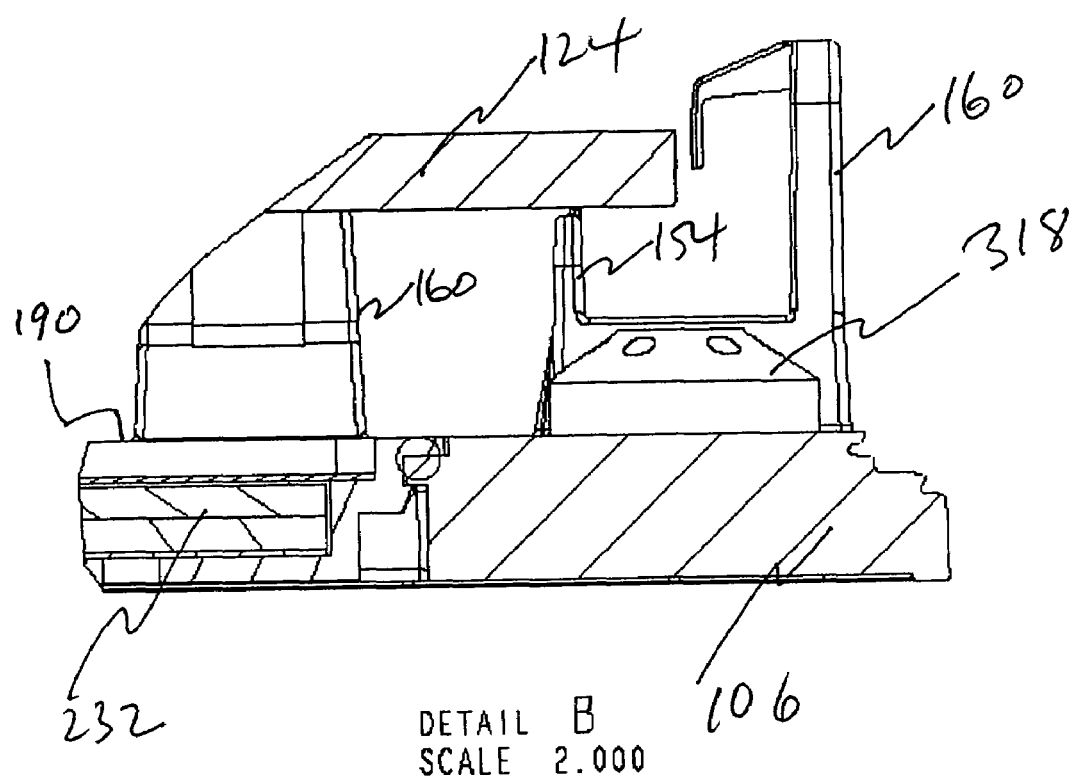
FIG. 9 is still another detailed view showing the purge port of FIG. 8.
Figure 10:
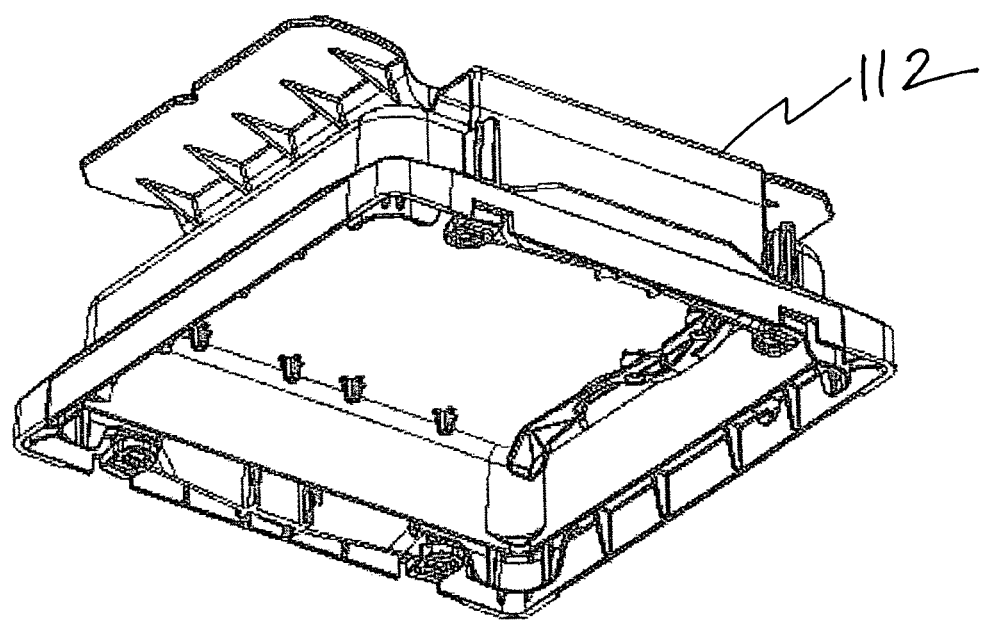
FIG. 10 is a bottom perspective looking up of the cover portion showing the inside surface of the cover portion according to an alternate embodiment of the present invention.
Figure 11:
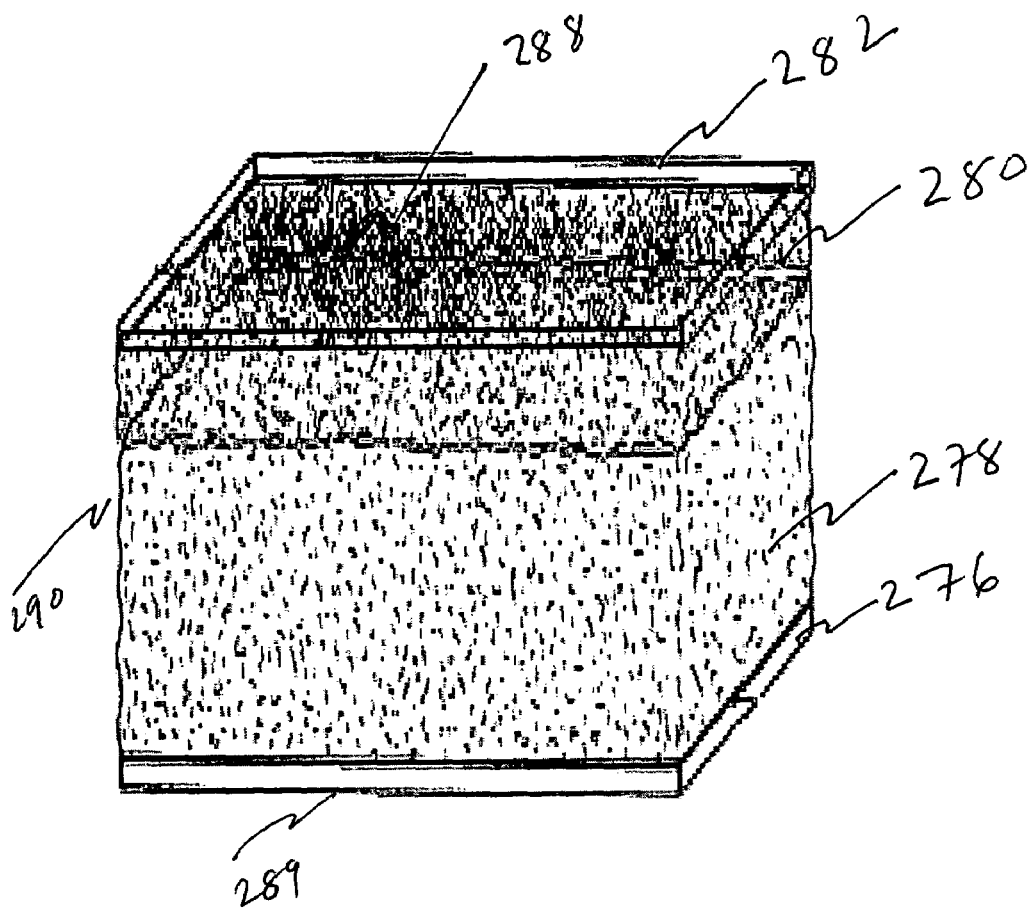
FIG. 11 is perspective view of an exemplary filter according to the present invention.

The door portion 106, best shown in FIGS. 2, 4 and 5 includes an opposed upper door surface 136 and a lower door surface 142 separated by a lateral wall 148. A plurality of reticle supports 154, reticle side positioning members 160 and back positioning members 166 extend outwardly from and are disposed in spaced apart relationship adjacent an upper periphery 172 of and generally about a central portion 178 of the upper door surface 136. The reticle supports 154 are configured to hold the reticle 124 at a predefined height 156 above upper door surface 136. The reticle side positioning members 160 and the back positioning members 166 serve to guide manual positioning of the reticle 124 and ensure proper lateral and rearward placement of the reticle on the reticle supports 154 so that the reticle substantially occupies and its volume bounded by a reticle receiving region 168 associated with the door portion 106 and defined by the reticle supports 154, the reticle side positioning members 160 and the back positioning members 166 as best depicted in FIG. 3. A Gasket 184 loops along the upper periphery 172 on the door surface 136. Preferably, the door portion 106 and the carrier shell 112 conform to the shape of reticle 124.

Referring now to FIGS. 2, 3 and 4, the door portion 106 is provided with a central hole 190 extending through the door portion 106 and defined by a first opening 196 on the upper door surface 136, a second opening 202 on the lower door surface 142 and an inside peripheral wall 208 communicating the first opening 196 with the second opening 202. In an exemplary embodiment, illustrated in FIGS. 2, 3 and 4, the first and second openings 196 and 202 are substantially square shaped and are characterized by their respective first and second areas 212 and 214. The inside peripheral wall 208 extends generally parallel to the lateral wall 148 of the door portion 106 between the first and the second Openings 196 and 202. The inside peripheral wall 208 is configured with a peripheral shelf 220 suitable for securely supporting a filter frame 226 such that the filter frame 226 is substantially perpendicular to the first opening 196 and is located generally flush with the upper door surface 136.

In one embodiment best illustrated in FIG. 2, the filter frame 226 can be a semi-rigid, molded plastic receptacle in which a filter 232 in accordance with the present invention may be used. The filter frame 226 is substantially hat shaped with a peripheral flange 242 (alternatively identified as a lip) circumjacent an open end 248, a filter frame side wall 258 depending from the open end 248 and terminating at a closed end 252 to define a cavity 262 adapted to receive the filter 232. Closed end 252 has a structure defining a plurality of perforations 264 as best illustrated in FIG. 4. Filter frame side wall 258 includes a shoulder 268 with a shape complementary to the peripheral shelf 220 on inside peripheral wall 208. The filter frame is configured to be inserted through first opening 196 on upper door surface 136 and snug-fittingly received into central hole 190 for detachable mounting in door portion 106 with flange 242 resting on upper door surface 136 and shoulder 268 securely positioned on peripheral shelf 220 of inside peripheral wall 208. In alternate embodiments, an elastomeric seal or gasket such as for example, the gasket 184 described above, can be interposed between the shoulder 268 and the peripheral shelf 220 to provide a hermetic seal between the filter frame 226 and the filter 232.

Figure 12:
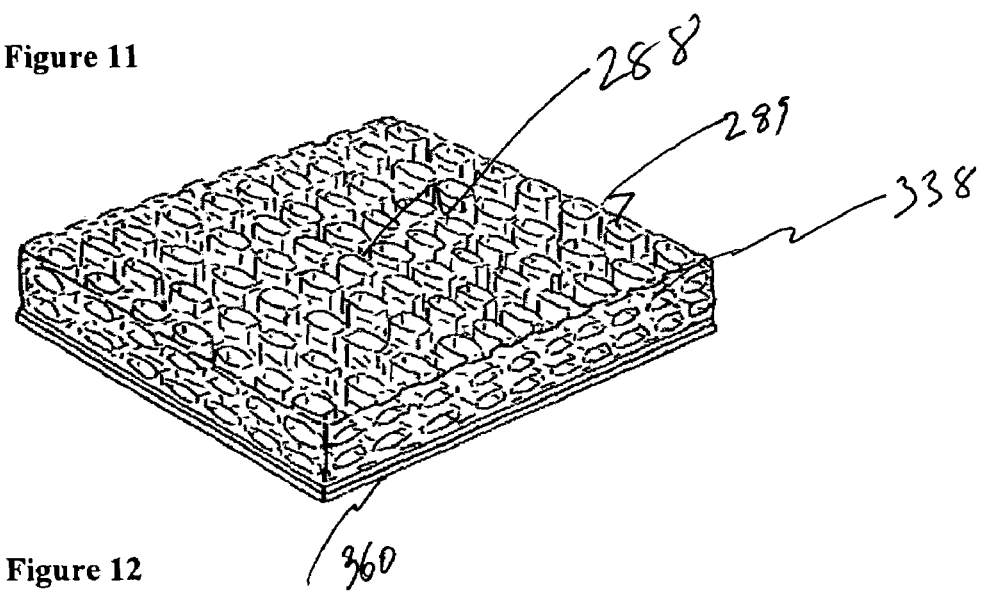
FIG. 12 is a perspective view of a high surface area filter according to a secondary embodiment of the present invention.

Filter 232 will next be described with reference to the illustrations of FIGS. 2 and 12. Filter 232 can have a variety of constructions each of which provide a fluid-permeable, clean, cost-effective, high efficiency, low-pressure drop, adsorptive composite filter such as the filters described in U.S. Pat. Nos. 7,014,693, 6,761,753, 6,610,128, and 6,447,584 the contents of which are incorporated herein by reference in their entirety. FIGS. 2 and 12 illustrate an exemplary embodiment of filter 232. Filter 232 is desirably a fluid-permeable filter that can include several types of adsorptive and non-adsorptive media. Adsorptive media can include, for example, chemisorptive media and physisorptive media. Non-adsorptive media may include particulate impermeable media. One of skill in the art will appreciate that the adsorptive media can be engineered with pore sizes for removal of particulate materials. Such adsorptive media is also exemplary of particulate impermeable media according to the present embodiment. Each type of media can be in separate filter elements. The term, "physisorption," refers to a reversible adsorption process in which the adsorbate is held by weak physical forces. In contrast, the term, "chemisorption", refers to an irreversible chemical reaction process in which chemical bonds are formed between gas or liquid molecules and a solid surface. The term "particulate impermeable" refers to the attribute of substantially filtering particulates having a size greater than a threshold size from a fluid flowing through the fluid-permeable but particulate impermeable media. Typically, the particulates may be dislodged from respective particulate impermeable media by reversing the fluid flow thereby substantially restoring the particulate filtering capacity of the media. Referring to FIG. 2, an exemplary filter 232 according to the present invention comprises a plurality of removable or replaceable filter elements (alternatively identified as layers, components, or laminas) arranged in parallel in a predefined series of layers. Exemplary Filter 232 includes a base layer 276 of a first particulate impermeable media, a first filter membrane 278 of a first adsorptive media, a second filter membrane 280 of a second adsorptive media and a cover layer 282 of a second particulate impermeable media with the absorptive media layers 278 and 280 being sandwiched between the particulate impermeable media base layer 276 and cover layer 282. In the primary embodiment, the base layer 276 and the cover layer 282 may comprise, for instance, a filtering non-woven polyester, polyamide or polypropylene material or other similar materials configured for the removal of particulate materials in a fluid stream. Other particulate filter media, such as for instance, a high efficiency particulate air (HEPA) filter medium or an ultra low penetration air (ULPA) filter medium, may also be used singly or in combination without departing from the scope of the present invention. The base and cover layers 276 and 282 prevent particulate incursion into the hermetically sealed space 118 from the ambient atmosphere (from the clean room for example) as well as egress of particulates from the hermetically sealed space 118 to the ambient atmosphere. In the preferred embodiment of the present invention, the first absorptive media associated with the first filter membrane 278 is a first physisorptive media. The term, "untreated," as used herein, means an activated carbon that has not been modified by chemical treatment to perform chemisorption; rather, untreated, active carbon remains as a physical, nonpolar, adsorbent. The first physisorptive filter element 278, shown in FIGS. 2 and 12 can include untreated, activated carbon. The carbon is porous (the specific surface area can be on the order of 1000 m2/g) and can be provided in the form of fibers or particles incorporated into a mat of polymer fibers, either woven or nonwoven. The untreated, activated carbon can be formed from a variety of sources, including coconut shell, coal, wood, pitch, and other organic sources. Further still, a sulfonated copolymer coating can be attached to the untreated, activated carbon. The medium of filter membrane 278 may include other materials such as for instance, granulated activated carbon, bead activated carbon, chemically impregnated carbon, chemically impregnated activated carbon, zeolites, cation exchange resin, anion exchange resin, cation exchange fiber anion exchange fiber, activated carbon fiber, and chemically impregnated activated carbon fiber. Physisorptive media of layer 278 specifically removes acids, organic and inorganic condensable contaminants such as C6-C10 as well as $SO_2$ gas. Such media are sold, for example, under the trade name Purolyte® by Purolyte Corporation. The second filter membrane 280 is a strongly acidic ion-exchange resin of a second adsorptive medium such as for instance, sulfonated divinyl benzene styrene copolymer in the form of microporous beads. The second adsorptive medium is configured to specifically capture ammonia ($NH_4$) and moisture ($H_2O$) both from within the hermetically sealed space 118 and from the ambient atmosphere of the clean room. Such media are sold under the trade name, AMBERLYST® 15DRY or AMBERLYST® 35DRY, by Rohm and Haas. Catalysts with physical properties outside the ranges described above can also be used. The base layer 276 and the cover layer 282 can also serve to retain the granular or particulate media in adsorptive layers 278 and 280. One of skill in the art will recognize that various combinations of the number of layers, the arrangement of the layers relative to each other, and media types forming the layers may be advantageously used without departing from the scope of the present invention. For example, in an alternate embodiment of the present invention chemisorptive and a physisorptive filter elements can be used. The relative thicknesses of the chemisorptive filter element and the physisorptive filter element being engineered so that the useful life of the two filter elements will be exhausted at approximately the same time in a given environment. Accordingly, a chemisorptive filter element formed of sulfonated polymer can be made thinner than a physisorptive filter element formed of untreated carbon since the physisorptive properties of the carbon will typically be exhausted more quickly than the chemisorptive properties of the acidic, sulfonated polymer. In a different embodiment, the chemisorptive and physisorptive media may be present within a single filter layer. In yet another embodiment, the multiplicity of filter elements may be sequentially supported in a frame container (not shown) to provide a multi-stage filter through which air can pass in a direction perpendicular to each of the layers. Such a multi-stage filter can be replaced as a whole after its filtration capacity is exhausted. Alternatively, filter elements having a high-surface area 338 may be formulated by forming each medium as a packed array of three dimensional cells in FIG. 13 as disclosed in the prior art. Such a high-surface area 338 filter may be formed by pleating the medium into an accordion-like structure. A prefilter layer (not shown) of hydrophilic medium, which may be separately removable from the filter 232, may be incorporated above the base layer 276 of the cover layer 282.

Still referring to FIG. 2, layers 276, 278, 280 and 282 preferably have the same shape 287. All the layers have the same surface area 288 bounded by the perimeter 289 of the shape 287 but may have different thicknesses. In assembled condition, the several layers 276, 278, 280 and 282 are sequentially disposed within the cavity 262 of the filter frame 226 to form a multi-stage filter having a composite sandwich structure of a thickness 290. The filter frame 226 is inserted through the first opening 196 on the upper door surface 136 and is detachably mounted into the central hole 190 with the flange 242 resting on the upper door surface 136 with the shoulder 268 being supported on the peripheral shelf 220. In a related embodiment, the filter frame 226 and the filter 232 comprise a cartridge 270 which may be inserted into and removed from the central hole 190 on the upper door surface 136 of the door portion 106 as described in U.S. Pat. No. 6,319,297, the entire contents of which is incorporated herein by reference in its entirety.

In the primary embodiment of the present invention best explained with reference to FIGS. 2, 3 and 5, the first area 212 of the first opening 196 is configured to be substantially proportional to the surface area 129 of the second patterned surface 128 of the reticle 124. According to one aspect of the particular embodiment, the first area 212 is at least 50% of the surface area and in a further embodiment the surface area is at least sixty percent (60%) of the surface area 129 and preferably in the range of seventy-five percent (75%) to one hundred percent (100%) of the surface area 129. In the preferred embodiment of the present invention, the first area 212 is substantially concentric with reticle receiving region 168. Furthermore, the first opening 196 and the location of reticle supports 154 are arranged so that in a assembled configuration, i.e. when the carrier shell 112 is mated to the door portion 106 and the reticle 124 is supported on the reticle supports 154, the filter 232 is located with the surface area 288 disposed opposite at least a portion of second patterned surface 128 within the hermetically sealed space 118 such that reticle perimeter 130 overlies perimeter 289 of surface area 288. One of skill in the art will recognize that other operative configurations of surface area 288 and second patterned surface 128 are possible without departing from the scope of the present invention. All of the aforementioned operative configurations are selected to maximize the extent of the surface area 288 relative to the second patterned surface 128 based in part upon the dimensions of the hermetically sealed space 118, the diffusion length generated during reticle carrier purging, reticle processing, transport, shipping and storage and other conditions the reticle 124 might encounter during its residency within the reticle carrier 100. The surface area 288 is disposed proximate the second patterned surface 128. By selecting the extent and location of surface area 288 in the manner of the present invention, the probability, that a particulate present within or entering the hermetically sealed space 118 will preferentially encounter and settle upon the surface 288 instead of diffusing onto the secondary patterned surface 128, is maximized. To those skilled in the art, the extent of surface area 288 is representative of the total number of fluid passages available for entry of a fluid into the filter 232. The term "high-surface area" associated with reference numeral 338, on the other hand, refers to the effective surface area of the total filter media available for filtration as the fluid flows through the entire thickness 290 of the filter 232. The effective surface area controls adsorption of gases and chemical reactions. In this regard, the filter 232 differs from the prior art SMIF pod filters in that the filter 232 of the present invention is structurally a significant component of the door portion 106 because surface 288 can extend over a substantial portion of the upper door surface 136. Furthermore, in the assembled configuration, base layer 276 is positioned on closed end 252 so that filter 232 places the hermetically sealed space 118 in fluid communication with the ambient atmosphere outside the reticle pod 100 through the plurality of perforations 264 as best seen in FIG. 4.

The primary embodiment of the present invention provides means for limiting the exposure of the filter media 276, 278, 280, 282 and other media that the filter 232 may comprise of, to the ambient atmosphere external to the reticle carrier 100. One such means is exemplified in the illustration of FIGS. 2 and 4. One skilled in the art will appreciate that the extent of surface 288 of the filter 232 in fluid communication with the hermetically sealed space 118 within the reticle carrier 100 is generally maximized as explained above. However, the extent of the base layer 276 of the filter 232 in direct communication with the ambient atmosphere is much smaller due to the limited number of perforations 264 and the limited area 266 of each perforation. Another means provided in the present invention include a fluid impermeable membrane 360 adjacent closed end 252 below base layer 276. Angularly cut criss-crossed slits (not illustrated) in the fluid impermeable membrane 360, the slits being preferably located opposite perforations 264, allow the fluid impermeable membrane slit portions to extend axially thus opening when the interior of the pod is pressurized in the purge mode. Generally the pod will not be subjected to a vaccum thus the slit portions will not open inwardly only outwardly effectively operating as a multiplicity of one-way valve which would open during the flow of fluid out of the reticle carrier 100. Similar valves are described in U.S. Pat. No. 5,482,161, the entire contents of which is incorporated herein by reference. Additionally, the outer membrane 360 can be a hydrophobic membrane to prevent incursion of moisture from the ambient atmosphere into the reticle carrier 100 through the filter 232. When the SMIF pod is pressurized providing a significant outward flow through the filter the hydrophobic characteristic may be overwhelmed and allow the exit of air or purge gas with some moisture being carried therewith. Under static minimal in and out flow through the filter, the hydrophobic effect is expected to effectively reduce the flow of moisture laden air from the exterior to the interior.

According to the primary embodiment of the present invention, the concentration of moisture within the hermetically sealed space 118 is preferably maintained at concentration levels approaching a few parts per billion (ppb). Using prior art approaches, such as dessicants for example, moisture concentrations within the hermetically sealed space 118 can be controlled only to within a few parts per million (ppm). The level of humidity control achieved by coupling reticle pod 100 to a purging system which periodically flows a very dry gas, such as for example dry nitrogen gas or dry argon, through the hermetically sealed space 118. Referring now to FIGS. 2, 6-9 there is illustrated the construction of a reticle structure 100 equipped for coupling to a purging system (not shown) according to a primary embodiment of the present invention. As seen in FIG. 2, upper periphery 172 of door portion 106 is configured with injector and extractor ports 306 and 312 extending through door portion 106 between upper door surface 136 and lower door surface 142 in a direction generally parallel to lateral wall 148 of door portion 106. Injector port 306 and extractor port 312 are configured to coaxially receive an injector fitting 318 and extractor fitting 324. Injector and extractor fittings 318, 324 may be threadably coupled to injector and extractor ports 306 and 312 respectively. Other connection means may also be used without departing from the scope of the invention. Injector fitting 318 is detachably coupled to gas inlet line (not illustrated). Extractor fitting 324 is detachably coupled to a gas removal line (not illustrated) which may in turn be connected to a gas evacuation means (not illustrated). Each of the injector fitting 318 and extractor fitting 32 is equipped with a check valve 330 configured to allow a unidirectional flow past and prevent ingress or egress of gaseous or particulate contaminants into the hermetically sealed space 118 when the system is not in use. Diaphragm valves with slits such as those described in U.S. Pat. No. 5,482,161 referenced above may also be employed in conjunction with or without the check valves 330. This is a mechanical means for limiting the exposure of the filter media 276, 278, 280, 282 and other media that the filter 232 may comprise of, to the ambient atmosphere external to the reticle carrier 100. One of skill in the art will recognize that injecting a very dry purge gas, for example dry nitrogen gas and dry argon gas, under pressure into the hermetically sealed space 118 will cause at least a portion of the purge gas to egress through the filter 232 and out into the ambient atmosphere through the closed end 252. An apparatus and method of purging the reticle carrier 100 is described in U.S. Pat. No. 5,988,233 and U.S. Pat. No. 5,810,062, the entire contents of the two patents being incorporated herein by reference in their entirety. In an alternate embodiment, the extractor fitting 324 is replaced by an injector fitting 318 coupled to the gas inlet. In this configuration, the hermetically sealed space 118 is pressurized by the purge gas flowing into it through the injector fittings 318. The purge gas exits the hermetically sealed space 118 through the filter 232. Generally, purging the hermetically sealed space 118 removes trace contaminants by entraining them in the gas flow. Purging with dry gas also dehumidifies the filter 232. Purging under pressure may dislodge and thus remove particulates and other contaminants that may be weakly bonded to the physisorptive media filter elements and the filter elements that specifically filter particulates. In effect, purging regenerates filter 232 by replenishing its capacity to adsorb contaminants. One of skill in the art will appreciate that the capacity of the filter 232 of the present invention may also be replenished by replacing the depleted filter 232.

Of course, many alternative embodiments of the present environmental control for a SMIF reticle pod are possible and are within the scope of the invention, as will be appreciated by those of skill in the art. Such embodiments would include, but are not limited to, varying the numbers and locations of the layers comprising the filter, varying the location of the filter, varying the area of the filter, using several smaller filters and using a plurality of purge ports.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples described herein.

The invention claimed is:

1. A reticle SMIF pod configured to support a reticle within a controlled environment maintained substantially free of crystal growth causing contaminants, the reticle being characterized by a patterned surface having a shape and a patterned area, the reticle SMIF pod comprising:
   a pod base portion and a pod shell portion cooperating to form the controlled environment, the pod base portion including a first surface configured to lie interiorly of the controlled environment, a second surface configured to lie exteriorily of the controlled environment, and a central hole surrounded by and defining a gas flow path between first and second surfaces;
   a plurality of reticle supports and guides mounted on the first surface to support a reticle thereon, the reticle supports and guides defining a reticle receiving region having a receiving surface, the receiving surface being substantially coextensive with the patterned surface when the reticle is received on the pod base;
   a filter frame having an open end, a perforated bottom end, and a lateral wall connecting the open end to the perforated bottom end to define a longitudinal gas flow passage therebetween, the filter frame shaped to be closely received within the central hole in gas-tight engagement with the pod with the open end proximate the first surface and the perforated bottom end recessed from the first surface; and
   a layered filter having an extent defining a filter shape having a filter area, the layered fitter disposed within the gas flow passage in sealed engagement with the open end and so that substantially all the gas entering or leaving the filter passes through the filter area, the filter area being a substantial fraction of the patterned area.

2. The reticle SMIF pod of claim 1 wherein the filter area is at least sixty percent (60%) of the patterned area.

3. The reticle SMIF pod of claim 1 wherein the filter shape is substantially identical to the shape of the patterned surface.

4. The reticle SMIF pod of claim 1 wherein the filter area is located so that the receiving surface is concentric with and overlies the filter area and is substantially proximate the receiving surface.

5. The reticle SMIF pod of claim 1 wherein the filter area substantially defines the first surface of the pod base portion and is the sole inlet and outlet of gas from the controlled environment.

6. The reticle SMIF pod of claim 1 wherein the layered filter comprises a plurality of parallel filter elements located within the filter frame wherein filter elements are selected for removing at least a portion of said crystal growth causing contaminants from the gas entering or leaving the filter.

7. The reticle SMIF pod of claim 6 wherein the plurality of parallel filter elements includes at least one filter element comprising a particulate filtering medium and at least one filtering element comprising adsorbent medium for adsorbing gaseous contaminants.

8. The reticle SMIF pod of claim 7 wherein the adsorbent medium is capable of adsorbing at least one gaseous contaminants selected from the group consisting of acids, organic and inorganic condensable contaminants, sulphur dioxide ($SO_2$) gas, ammonia ($NH_4$) and moisture ($H_2O$) wherein the gaseous contaminants are present in one or more of the controlled environment and the gas entering or leaving the filter.

9. The reticle SMIF pod of claim 8 wherein the concentration of contaminants within the controlled environment is continuously maintained to less than at least one part per billion.

10. The reticle SMIF pod of claim 1 wherein the filter is captively held within the filter frame to form a cartridge, the cartridge configured to be releasably captured within the central opening so as to be replaceable so as to replenish a filtering capacity of the filter.

11. The reticle SMIF pod of claim 1 wherein the pod portion further comprises:
   at least one purge port comprising an opening extending between the first and second surfaces of the pod portion;
   a gas injector sealing received within the purge port, the gas injector configured to be coupled to a gas inlet for injecting a purge gas into the controlled environment of the pod to flush the controlled environment of contaminants and regenerate the filter; and
   a check valve configured to prevent gas transfer to and from the controlled environment whenever the purge gas is not being injected into the controlled environment.

12. The reticle SMIF pod of claim 11 wherein the purge gas is selected from the group consisting of very dry nitrogen gas and very dry argon gas.

13. The reticle SMIF pod of claim 1 wherein the open end has a gas-contact area substantially equal to the filter area and the perforated bottom end includes a plurality of perforations wherein each perforation has a perforated area in gas communication exteriorly of the controlled environment, and wherein a sum of the perforated areas is substantially smaller than the gas-contact area of the open end.

14. A method for reducing crystal forming contaminants within a controlled environment surrounding a reticle supported within a reticle SMIF pod, the reticle having a patterned surface of a shape, the shape having a patterned area, the method comprising:

providing a pod base portion and a pod shell portion, the pod shell portion capable of sealingly engaging the pod base portion to define the controlled environment, the pod base portion configured with opposed first and second surfaces surrounding a central opening and at least one purge port, the central opening and the purge port defining a gas flow path between the first and the second surfaces wherein the first surface located interiorily of the controlled environment and the second surface located exteriorly of the controlled environment;

providing a plurality of reticle supports on the first surface, the reticle supports defining a reticle receiving surface substantially coextensive with the patterned surface when the reticle is received on the reticle supports, the reticle receiving surface having a shape and an area;

inserting a filter cartridge into the central opening, the filter cartridge having an open end, a bottom perforated end, a lateral wall defining a gas passageway between the open end and the bottom perforated end, and a layered filter with a filter area captivated in the gas passageway so that the filter area is proximate the open end, the filter cartridge being inserted into the central opening so as to position the filter area proximate the first surface and the bottom perforated end recessed from the area;

selecting an extent of the filter area so that the filter area is a substantial fraction of the patterned area;

sealingly securing a gas injector fitting into the at least one purge port, the gas injector fitting being connected to a purge gas inlet; and regenerating the filter by periodically forcing a purge gas through the purge gas inlet into the controlled environment and in contact with the filter area to substantially flush out crystal forming contaminants from the controlled environment and the filter.

15. The method of claim 14 wherein the filter area is at least sixty percent (60%) of the patterned area.

16. The method of claim 14 wherein the filter area is substantially shaped to conform to the shape of the reticle receiving surface.

17. The method of claim 14 wherein the filter area is located so that the reticle receiving surface is concentric with and overlies the filter area with the filter area positioned in close proximity to the receiving surface.

18. The method of claim 14 wherein the filter area substantially defines the first surface of the pod base portion.

19. The method of claim 14 wherein the layered filter comprises a plurality of parallel filter elements located within the filter frame wherein each filter element is selected for removing at least a portion of said crystal growth causing contaminants from the gas entering or leaving the filter.

20. The method of claim 19 wherein the layered filter includes at least one particulate filtering element for filtering particulates and at least one adsorbent element wherein the adsorbent element comprises an adsorbent medium capable of adsorbing at least one gaseous contaminant known to contribute to crystal growth, the gaseous contaminant selected from the group consisting of acids, organic and inorganic condensable contaminants, sulphur dioxide ($SO_2$) gas, ammonia ($NH_4$) and moisture ($H_2O$) and wherein the gaseous contaminants are present in one or more of the controlled environment and the gas entering or leaving the filter.

21. The method of claim 19 wherein the concentration of crystal growth causing contaminants within the controlled environment is continuously maintained to at least one part per billion.

22. A reticle SMIF pod comprising:
a pod base portion and a pod shell portion cooperating to form a controlled environment, the pod base portion including a first surface configured to lie interiorly of the controlled environment, a second surface configured to lie exteriorly of the controlled environment, and a central hole surrounded by and defining a gas flow path between first and second surfaces;
a plurality of reticle supports and guides mounted on the first surface to support a reticle thereon;
a reticle supported on the reticle supports and reticle guides, the reticle having a patterned surface susceptible to damage by crystal growth causing contaminants, the patterned surface having a shape and a patterned area;
a filter frame having an open end, a perforated bottom end, and a lateral wall connecting the open end to the perforated bottom end to define a longitudinal gas flow passage therebetween, the filter frame shaped to be closely received within the central hole in gas-tight engagement with the pod with the open end proximate the first surface and the perforated bottom end recessed from the first surface; and
a layered filter having an extent defining a filter shape having a filter area, the layered filter disposed within the gas flow passage in sealed engagement with the open end and so that substantially all the gas entering or leaving the filter passes through the filter area, the filter area being a substantial fraction of the filter area.

23. The reticle SMIF pod of claim 22 wherein the filter area is at least sixty percent (60%) of the patterned area.

24. The reticle SMIF pod of claim 22 wherein the filter area is substantially shaped to conform to the shape.

25. The reticle SMIF pod of claim 22 wherein the filter area is located so that the patterned surface is concentric with and overlies the filter area with the filter area located substantially proximate the patterned surface.

26. A method for reducing crystal formation on a reticle within a reticle SMIF pod, the reticle having a patterned surface of a shape, the shape patterned area, the method comprising the steps of:
providing the SMIF pod with a filter cartridge with an adsorbent characteristic, the filter cartridge having an inwardly exposed filter face extending over a substantial portion of the upper door surface and having a surface area at least 50% of the patterned area;
providing the SMIF pod with a pair of purge inlet ports with a check valve and positioning the purge inlet ports on opposite sides of the filter cartridge;
placing the reticle within a controlled environment of the reticle pod; and
purging the controlled environment with the reticle therein through the pair of purge inlet ports.

27. The method of claim 26 further comprising the step of concentrically positioning the reticle with respect to the filter face and positioning the filter face to confront said patterned surface of the reticle.

28. The method of claim 26 further comprising the step of regenerating the adsorbent characteristic of the filter cartridge by purging the reticle SMIF pod with at least clean dry air whereby the clean dry air exits the pod through the filter cartridge.

29. A method for reducing crystal formation on a reticle within a reticle SMIF pod, the reticle having a patterned surface of a shape, the shape having a patterned area, the method comprising the steps of:
providing a filter cartridge with an adsorbent characteristic, the filter cartridge in a wall of the reticle pod and having an inwardly exposed filter face having a surface area at least 50% of the patterned area and an outwardly exposed filter face exposed exteriorly of the reticle pod; and concentrically positioning the reticle with respect to the filter face and positioning the filter face to confront said patterned surface of the reticle.

30. The method of claim 29 further comprising the step of regenerating the adsorbent characteristic of the filter cartridge a plurality of times with the reticle therein by purging the reticle SMIF pod with at least clean dry air whereby the clean dry air exits the pod through the filter cartridge.

31. A method for reducing contaminants within a substrate container having a contamination sensitive substrate therein, the substrate having an exposed planar surface of a shape and having an area, the method comprising the steps of:

providing the container with a filter cartridge with an adsorbent characteristic, the filter cartridge having an inwardly exposed filter face having a surface area at least 50% of the exposed planar surface area of the substrate and the filter cartridge having an exteriorly exposed side openable to the exterior of the substrate container whereby purge gas from the interior of the container can enter the exposed filter face and pass through the filter and exit exteriorly of the container, and whereby the filter can absorb gaseous contaminants when the purge is not occuring, providing the container with a purge inlet port with a check valve providing one way flow of gas into the container for providing the purge gas and providing gas for regenerating the absorbent characteristic of the filter cartridge, storing the contamination sensitive substrate within the container an utilizing the filter cartridge to absorb gaseous contaminants when purge is not occurring, regenerating the adsorbent characteristic of the filter cartridge by purging the substrate container with at least clean dry air through the filter cartridge.

* * * * *